United States Patent
Kwon et al.

(10) Patent No.: US 7,586,808 B2
(45) Date of Patent: Sep. 8, 2009

(54) MEMORY DEVICE FOR USE IN HIGH-SPEED BLOCK PIPELINED REED-SOLOMON DECODER, METHOD OF ACCESSING THE MEMORY DEVICE, AND REED-SOLOMON DECODER HAVING THE MEMORY DEVICE

(75) Inventors: Hyung-joon Kwon, Seoul (KR); Il-man Bae, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 105 days.

(21) Appl. No.: 11/396,775

(22) Filed: Apr. 3, 2006

(65) Prior Publication Data

US 2006/0184863 A1  Aug. 17, 2006

Related U.S. Application Data

(62) Division of application No. 10/272,427, filed on Oct. 16, 2002, now Pat. No. 7,055,087.

(30) Foreign Application Priority Data

Oct. 17, 2001 (KR) ................. 2001-64015

(51) Int. Cl.
*G11C 8/12* (2006.01)
(52) U.S. Cl. .......................... 365/230.03; 365/189.04
(58) Field of Classification Search ............ 365/230.03, 365/230.04, 230.05, 230.06, 189.04, 189.05; 714/784, 763, 798, 776; 711/169, 5, 150, 711/168
See application file for complete search history.

(56) References Cited

U.S. PATENT DOCUMENTS

| 5,367,494 | A  | * | 11/1994 | Shebanow et al. | ...... 365/230.03 |
| 5,633,686 | A  | * | 5/1997 | Boden | ......................... 348/441 |
| 5,701,270 | A  | * | 12/1997 | Mohan Rao | ........... 365/230.03 |
| 5,771,199 | A  | * | 6/1998 | Lee | ........................ 365/230.03 |
| 6,079,046 | A  | * | 6/2000 | Tamura et al. | .............. 714/781 |
| 6,639,865 | B2 | * | 10/2003 | Kwon | ..................... 365/230.03 |
| 7,027,547 | B1 | * | 4/2006 | Hwang | ........................ 375/372 |

* cited by examiner

*Primary Examiner*—J. H. Hur
*Assistant Examiner*—Douglas King
(74) *Attorney, Agent, or Firm*—F. Chau & Associates, LLC (57) ABSTRACT

A random access memory (RAM) device for use in a high-speed pipelined Reed-Solomon decoder, a method of accessing the memory device, and a Reed-Solomon decoder having the memory device are provided. The memory device, which data is written to and read from at the same time during decoding of one frame of data, includes a random access memory (RAM) having a plurality of banks; and a control circuit for setting a first bank pointer, which selects a first bank among the plurality of banks, and a second bank pointer which selects a second bank among the plurality of banks, wherein the first and second bank pointers are set to banks with a predetermined offset every frame of data.

6 Claims, 6 Drawing Sheets

MEMORY DEVICE FOR USE IN HIGH-SPEED BLOCK PIPELINED REED-SOLOMON DECODER, METHOD OF ACCESSING THE MEMORY DEVICE, AND REED-SOLOMON DECODER HAVING THE MEMORY DEVICE

CROSS-REFERENCE TO RELATED APPLICATIONS

This application is a Divisional of U.S. patent application Ser. No. 10/272,427 filed on Oct. 16, 2002 now U.S. Pat. No. 7,055,087, which is fully incorporated by reference herein, and which claims foreign priority under 35 U.S.C. § 119 to an application entitled "MEMORY DEVICE FOR USE IN HIGH-SPEED BLOCK PIPELINED REED-SOLOMON DECODER, METHOD OF ACCESSING THE MEMORY DEVICE, AND REED-SOLOMON DECODER HAVING THE MEMORY DEVICE" filed in the Korean Industrial Property Office on Oct. 17, 2001 and assigned Application Ser. No. 2001-64015, the contents of which are hereby incorporated by reference.

BACKGROUND OF THE INVENTION

1. Field of the Invention

The present invention relates to a Reed-Solomon decoder, and more particularly, to a memory device for use in a high-speed pipelined Reed-Solomon decoder, a method of accessing the memory device, and a Reed-Solomon decoder having the memory device.

2. Description of the Related Art

With advancement in digital signal processing techniques, a variety of techniques for dealing with errors in data in a channel or media, i.e., restoring the original state of data, have been developed. Among the variety of error correction techniques, the Reed-Solomon (RS) code, which is a kind of linear block code, has been extensively used. In general, a RS encoder adds parity symbols of 2 t to k data symbols to form a code word including n-bits, e.g., 8-bit symbols.

Here, 2 t will now be expressed to be the same as n-k, and the RS code word is specified as RS(n,k). The RS code has been widely used because of the great error correction capability of an RS decoder and its efficient encoding/decoding procedures.

A decoding procedure performed by the RS decoder is more complicated than an encoding procedure. Also, an increase in systems requiring high-speed digital data processing has resulted in a need for hardware capable of decoding data through high-speed digital processing.

In general, the RS decoder includes five or four-stage processing blocks: five stages for both error and erasure corrections, and four stages for only error correction. As for the five-stage RS decoder for both error and erasure corrections, decoding is carried out by the following procedures: (i) a first-stage processing block s1 generates a syndrome from input data, and counts and buffers erasure flags applied in synchronization with the input data; (ii) a second-stage processing block s2 modifies the syndrome in response to the buffered erasure flags and generates an erasure locator polynomial; (iii) a third-stage processing block s3 calculates the coefficients for the error locator polynomial and an error evaluator polynomial, using the modified syndrome and the erasure locator polynomial. Here, a predetermined algorithm, such as the Euclid algorithm, may be applied to find the coefficients of the polynomials; (iv) a fourth-stage processing block s4 calculates actual error locations and error values from the error locator and error evaluator polynomials with the coefficients, using the Chien Search algorithm; and (v) a fifth-stage processing block s5 corrects the errors of the input data according to the known error locations and error values. Meanwhile, as for a RS decoder for only error corrections, the second-stage processing block s2 is not required, and therefore, decoding is performed only by four-stage procedures.

During the RS decoding process, memory access is required in the first and fifth stages (first and fourth stages for only error correction). That is, the input data are written to a memory in the first stage, and the data stored in the memory is read to correct errors in the fifth stage. Thus, each stage of the decoding can be influenced by time required to access the memory.

A growing need for high-speed processing systems has resulted in development of a pipelined RS decoder in which processing blocks for the respective stages are arranged in a pipeline structure. However, in the case of the pipelined RS decoder, a processing stage having the longest latency in the decoding process contributes as the bottleneck stage in processing one frame of data. Thus, each stage of the decoding can be influenced by time required to access the memory. Given that the length of one frame of data is n, the maximum latency for each stage can be defined within n cycles. However, when decoding one frame of data, 2n or more cycles are required for accessing the memory in the first and fifth stages. In consequence, the memory access time is two or more times longer than the latency for each stage, so that the operating speed of the entire circuit decreases.

To solve this problem, approaches have been made to increase the rate of a system clock signal for the operation of each stage two times or more as fast as the rate of a data input clock signal used to write data in a memory. However, an increase in the system clock signal rate consumes a large amount of power. Also, if a data input clock signal rate is fast, the system clock signal rate cannot be increased over a predetermined rate. The operation speed of the RS decoder is limited by the memory access time.

SUMMARY OF THE INVENTION

To solve the above and other problems, the objectives of the present invention are to provide a memory device for use in a high-speed block pipelined Reed-Solomon (RS) decoder, which enables fast memory access, so that the operation speed of the RS decoder increases, a method of accessing the memory device, and a high-speed block pipeline Reed-Solomon decoder.

Accordingly, to achieve one aspect of the above objectives, there is provided a random access memory (RAM) which data is written to and read from at the same time during decoding of one frame of data, the RAM including a plurality of banks, wherein when a first bank is selected from the plurality of banks in response to a first control signal, predetermined data is written to the first bank, when a second bank is selected from the plurality of banks in response to a second control signal, the data stored in the second bank is output, and the first and second banks are selected with a predetermined offset per frame of data.

Here, the RAM is SDRAM or DRAM. The size of each bank is determined to be sufficient to store one frame of data. The writing/reading of data is performed via an input/output pin.

The first control signal includes a first bank selection signal for selecting the first bank and a write command signal for commanding writing of the predetermined data to the first bank, and the second control signal includes a second bank selection signal for selecting the second bank and a read command signal for commanding reading of data from the second bank.

To achieve another aspect of the above objectives, there is provided a buffer which data is written to and read from at the same time during decoding of one frame of data, the buffer including random access memory (RAM) having a plurality of banks; and a control circuit for setting a first bank pointer, which selects a first bank among the plurality of banks, and a second bank pointer which selects a second bank among the plurality of banks, wherein the first and second bank pointers are set to banks with a predetermined offset every frame of data.

The first bank pointer is a write bank pointer that selects the first bank to write predetermined data to the first bank, and the second bank pointer is a read bank pointer that selects the second bank to read the predetermined data stored in the second bank. Preferably, the size of each bank is determined to be sufficient to store one frame of data.

To achieve still another aspect of the above objectives, there is provided a pipelined Reed-Solomon decoder including a plurality of pipelined processors for receiving an input Reed-Solomon code word, and calculating error locations and error values which are included in the input code word; and a buffer circuit for temporarily storing the input code word while the plurality of pipelined processors calculate error locations and error values. Here, the buffer circuit includes RAM including a plurality of banks; and a control circuit for setting a first bank pointer, which selects a first bank from the plurality of banks, and a second bank pointer which selects a second bank from the plurality of banks. The first and second bank pointers are set to banks with a predetermined offset every frame of data.

The first bank pointer is a write bank pointer that selects the first bank to write predetermined data to the first bank, and the second bank pointer is a read bank pointer that selects the second bank to read the predetermined data stored in the second bank. Preferably, the size of each bank is determined to be sufficient to store one frame of data.

The predetermined offset is N-1 when the plurality of pipelined processors include N pipeline processor stages, wherein N is an integer. The plurality of pipelined processors and the buffer circuit operate in response to the same clock signal. The code word is n bytes and each of the plurality of banks has n bytes.

Preferably, the offset is set to be four banks when the pipelined RS decoder is for error and erasure corrections, and be three banks when the pipelined Reed-Solomon decoder is only for error correction.

To achieve still another aspect of the above objectives, there is provided a method of writing and reading data to and from RAM having a plurality of banks at the same time during the decoding of a plurality of frames of data, the method including setting an offset between a first bank pointer, which selects a first bank from the plurality of banks, and a second bank pointer which selects a second bank from the plurality of banks; and reading data stored in the second bank in response to a read command concurrently with writing predetermined data to the first bank in response to a write command. Here, the first and second bank pointers maintain the offset to banks during the decoding of one frame of data.

To achieve still another aspect of the above objectives, there is provided a method of decoding data input to a pipelined Reed-Solomon decoder, the method including (a) setting an offset between a write bank pointer, which selects a first bank from a plurality of banks of a random access memory (RAM) in response to an error correction mode and a read bank pointer that selects a second bank from the plurality of banks; (b) determining whether to apply a write command for commanding the writing of data and a read command for commanding the reading of data stored; (c) reading data stored in the second bank in response to the read command concurrently with writing the input data to the first bank in response to the write command; and (d) correcting errors in the read data, wherein the offset is the same per frame of data.

Preferably, the offset is set to be N-1 banks when decoding stages in the pipelined Reed-Solomon decoder includes N stages (N is an integer), be 4 banks in a first error correction mode in which error and erasure corrections are performed, and be 3 banks in a second error correction mode in which only error correction is performed.

To achieve still another aspect of the above objectives, there is provided a pipelined Reed-Solomon (RS) decoder for decoding input data and correcting errors contained in the input data, the RS decoder including a syndrome generator for generating a syndrome from the received input data; RAM including a plurality of banks, the RAM for writing the input data to a first bank selected from the plurality of banks and outputting stored data from a second bank selected from the plurality of banks; a polynomial coefficient generator for generating coefficients of an error locator polynomial and an error value polynomial from the generated syndrome; an error location/error value evaluator for calculating error locations and error values from the error locator polynomial and the error value polynomial, using the generated coefficients; and an error corrector for correcting errors in data output from the second bank in response to the error locations and values calculated by the error location/error value evaluator.

In the RAM, a first bank pointer and a second bank pointer, which select the first bank and the second bank, respectively during the decoding of one frame of data, are set to have an offset of one bank.

The RS decoder may further include a flag counter and buffer for counting erasure flags in synchronization with the input data and for buffering the erasure flags; an erasure locator polynomial generator for generating an erasure locator polynomial in response to the buffered erasure flags; and a syndrome modifier for modifying the syndrome, which is generated by the syndrome generator, with the buffered erasure flags, and outputting the modified syndrome to the polynomial coefficient generator, wherein the polynomial coefficient generator generates coefficients of the error locator polynomial and the error value polynomial in response to the modified syndrome and the erasure locator polynomial.

In the RAM, the first bank pointer and the second bank pointer, which select the first bank and the second bank, respectively, during the decoding of one frame of data, are set to have an offset of two banks.

BRIEF DESCRIPTION OF THE DRAWINGS

The above and other objectives, features and advantages of the present invention will become more apparent by describing in detail a preferred embodiment thereof with reference to the attached drawings in which.

DETAILED DESCRIPTION OF PREFERRED EMBODIMENTS

Hereinafter, a high-speed block pipelined Reed-Solomon (RS) decoder, a memory device for use in this RS decoder, and a method of accessing the memory device, according to the present invention, will be described with reference to the accompanying drawings.

Figure 1:
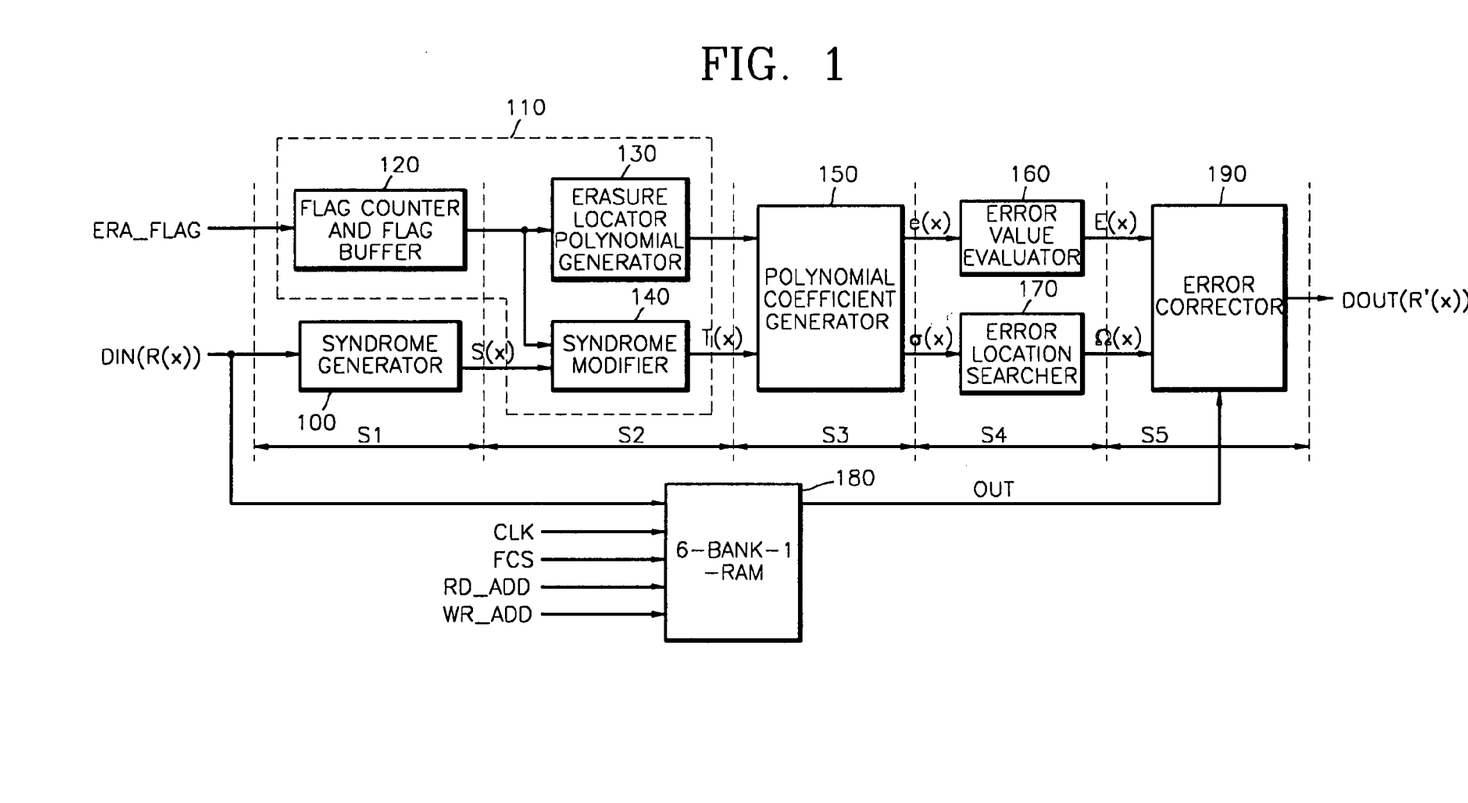
FIG. 1 is a block diagram of a high-speed block pipelined Reed-Solomon decoder used with a six-bank-1-RAM according to the present invention.

FIG. 1 is a view of a preferred embodiment of a high-speed block pipelined Reed-Solomon (RS) decoder used with a six-bank-1-RAM. Referring to FIG. 1, the RS decoder includes a syndrome generator 100, a flag counter and buffer 120, an erasure locator polynomial generator 130, a syndrome modifier 140, a polynomial coefficient generator 150, an error value evaluator 160, an error location searcher 170, a six-bank-1-RAM 180, and an error corrector 190.

The RS decoder of FIG. 1 is available for both error and erasure corrections, so that the above five processing stages s1 through s5 are pipeline-processed by the successive blocks of the RS decoder of FIG. 1. However, as for a RS decoder for only error correction, the block 110 is excluded from the RS decoder of FIG. 1, and thus, the four processing stages s1 and s3 through s5 are pipeline-processed.

In particular, the syndrome generator 100 generates a syndrome S(x) with external input data DIN, i.e., code word R(x). The flag counter and flag buffer 120 counts the number of erasure flags ERA_FLAG applied in synchronization with the input data DIN, and buffers the erasure flags ERA_FLAG. Here, the 'erasure' refers to errors whose locations in the input data DIN are known but whose values are unknown. In contrast, the 'error' refers to errors whose locations and values are both unknown. Thus, when erasure correction is required, erasure flags ERA_FLAG are input, and the number of the erasure flags ERA_FLAG is counted. If the number of the input erasure flags ERA_FLAG is beyond the allowable range of correction, error correction is exclusively performed.

Here, the allowable correction range can be determined such that error correction is carried out, for example, when 10 or more erasure flags ERA_FLAG are input. In addition, when no erasure flags ERA_FLAG are input, just error decoding is performed. The syndrome generator 100, and the flag counter and buffer 120 perform the first stage s1 of the RS decoding procedure. Basically, the flag counter and buffer 120 are not included in a RS decoder in which error correction is exclusively performed.

The six-bank-1-RAM 180, which temporarily stores the input data DIN, i.e., code word R(x), consists of six banks and employs a circular control mechanism to write or read data in response to a data input clock signal CLK. Also, the RAM 180 performs pipeline shift in response to a pipeline frame-changing signal (FCS) so as to perform each stage per frame.

Predetermined data is written to a selected one of the six banks according to the data input clock signal CLK, and predetermined data is read from a selected one of the six banks. The bank to which data is written is selected by a write address WR_ADD, and the bank from which data is read is selected by a read address RD_ADD. Here, the write address WR_ADD and the read address RD_ADD consist of 8 bits, respectively, and can be sent separately or all together to the RAM 180. The structure and operation of the RAM memory 180 will be described in greater detail later with reference to FIG. 3.

The syndrome modifier 140 modifies the syndrome S(x) generated by the syndrome generator 100 with the buffered erasure flags and outputs a modified syndrome T(x). When just error decoding is performed, modification of the syndrome is omitted. That is, the syndrome S(x) generated by the syndrome generator 100 is transferred to the polynomial coefficient generator 150. The erasure locator polynomial generator 130 generates an erasure locator polynomial using the buffered erasure flags. As for just error correction, the erasure locator polynomial generator 130 is not included in the RS decoder, and a constant, e.g., a constant of "1", is used instead of using the output value of the erasure locator polynomial generator 130. In other words, when the number of input erasure flags ERA_FLAG is equal to zero, or is beyond an allowable correction range, a constant of 1 is used, instead of generating an erasure locator polynomial. As shown in FIG. 1, the syndrome modifier 140 and the erasure locator polynomial generator 130 cooperatively perform the second stage s2 of the RS decoding procedure. When only error correction, not erasure correction, is performed, the second stage s2 is not performed.

The polynomial coefficient generator 150 generates the coefficients of an error locator polynomial σ(x) for calculating error locations, and an error evaluator polynomial e(x) for error evaluation, using the modified syndrome T(x) and a signal output from the erasure locator polynomial generator 130. In the embodiment shown in FIG. 1, the polynomial coefficient generator 150 is assumed to utilize a known Euclidean algorithm. However, it will be appreciated that any algorithm other than the Euclidean algorithm can also be used, and the coefficients for only the error locator polynomial σ(x) can be generated as needed. The polynomial coefficient generator 150 performs the third stage s3 of the RS decoding procedure. For just error correction, the elements of the block 110 are excluded from the RS decoder of FIG. 1, and thus, the coefficients of the error locator polynomial σ(x) and the error evaluator polynomial σ(x) are generated using the syndrome S(x) and the constant of 1.

The error location searcher 170 searches for error locations using the Chien Search algorithm from the error location polynomial σ(x). Here, the Chien Search algorithm is used to obtain the solution of the error location polynomial σ(x), but other algorithms may be used. The obtained solution is transformed into a polynomial. The transformed error locator polynomial, which is expressed as Ω(x), is used to calculate error locations. The error value evaluator 160 calculates error values using the error evaluator polynomial e(x) with the coefficients from the polynomial coefficient generator 150. The error values originate from the error locations found by the error location searcher 170. The error location searcher 170 and the error value evaluator 160 perform the fourth stage s4 of the RS decoding procedure. The error location searcher 170 and the error value evaluator 160 may be collectively referred to as an "error location and error value evaluator".

The error corrector 190 of FIG. 1 accesses the RAM memory 180 to read data written thereto, and corrects the errors present in the read data, using the error locations found by the error location searcher 170 and the error values calculated by the error value evaluator 160. In other words, the error corrector 190 corrects the errors in the data in the RAM 180, using the sum of the original data read from the RAM 180 and the calculated error values. Although not illustrated, each block of the RS decoder shown in FIG. 1 performs the corresponding stages s1 through s5 in response to a system clock signal.

Figure 2:
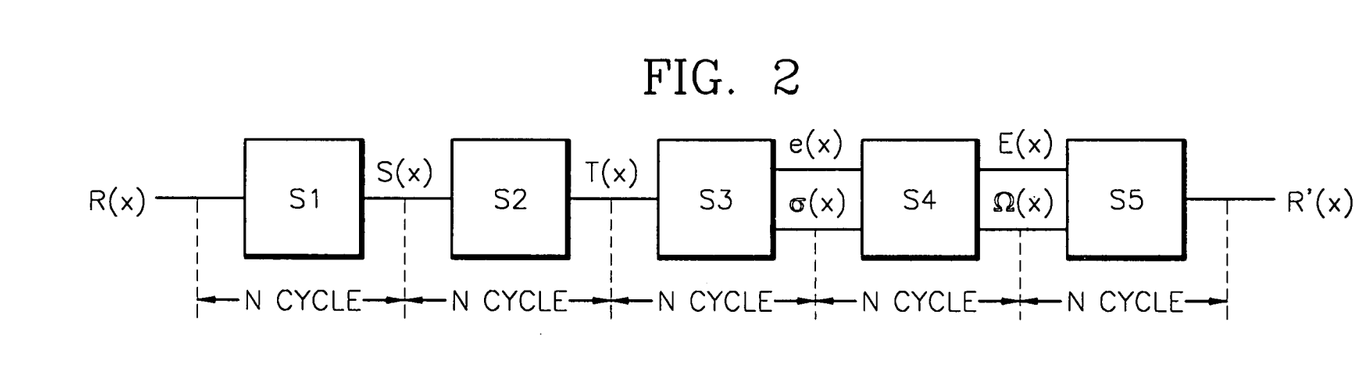
FIG. 2 is a diagram illustrating the latency in each block of the RS decoder of FIG. 1.

FIG. 2 is a view illustrating the latency in each of the stages s1 through s5 for pipelining processing by the successive blocks in the RS decoder of FIG. 1. Referring to FIG. 2, the longest latency of the blocks for operating the stages s1 through s5 can be determined within n cycles, provided that the length of a frame of input data, i.e., code word, is n. In the RS decoder according to the present invention, a six-bank-1-RAM of a circular structure is adopted, thus minimizing time loss in accessing memory for the operation of the stages s1 and s5.

Figure 3:
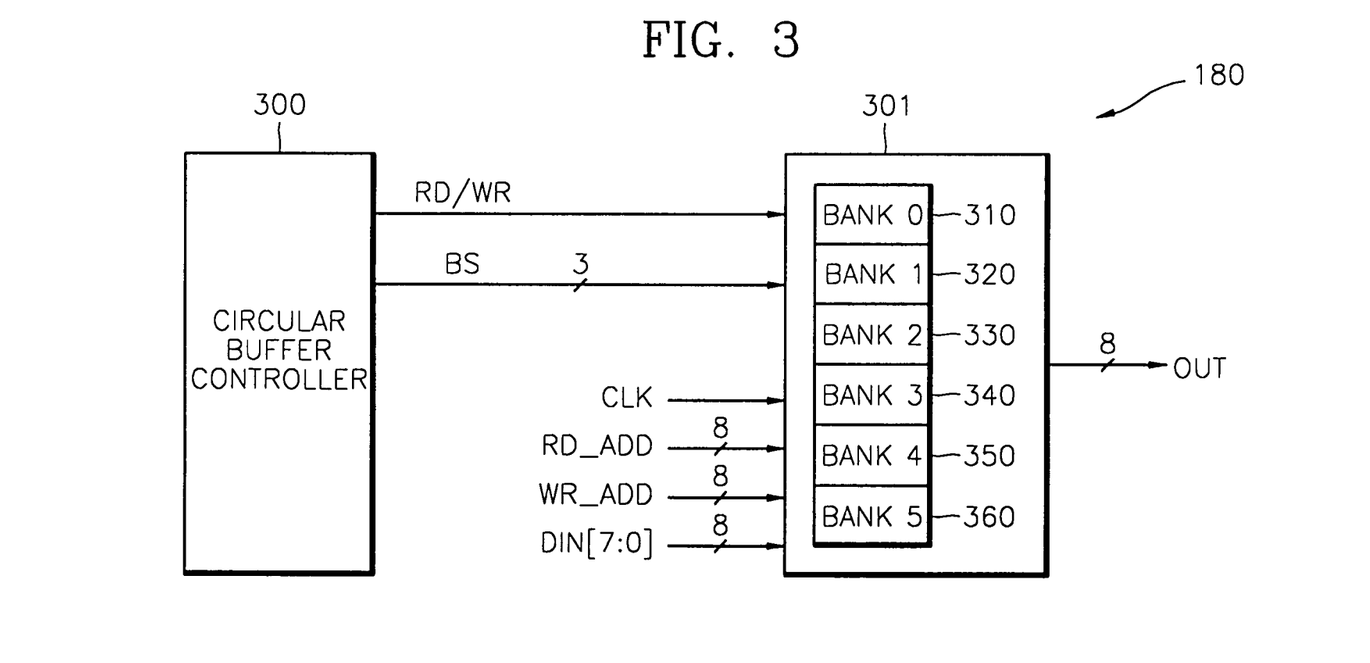
FIG. 3 is a block diagram of a six-bank-1-RAM according to the present invention.

FIG. 3 is a block diagram illustrating a preferred embodiment of a six-bank-1-RAM 180 according to the present invention. Referring to FIG. 3, the RAM 180 includes a circular buffer controller 300 and a bank block 301, the bank block 301 including first through sixth banks 310 through 360.

The circular buffer controller 300 outputs a read/write command RD/WR and a bank selection signal BS to the first through sixth banks 310 through 360. The bank selection signal BS of 3 bits is a signal for selecting one of the first through sixth banks 310 through 360. The bank selection signal BS can be referred to as an address. The read command RD is a signal for commanding the reading of data stored in a bank selected by the bank selection signal BS. The write command WR is a signal for commanding the writing of data to a bank selected by the bank selection signal BS. A bank selected by the bank selection signal BS, according to a preferred embodiment of the present invention, is shown in table 1. The bank selection signal BS consists of 3 bits, and the banks 310 through 360 in the RAM 310 are selected by a combination of each bit in the bank selection signal BS.

TABLE 1

|  | Bank 0 | bank 1 | Bank 2 | bank 3 | bank 4 | bank 5 |
| --- | --- | --- | --- | --- | --- | --- |
| bank select address 0 | 0 | 0 | 0 | 0 | 1 | 1 |
| bank select address 1 | 0 | 0 | 1 | 1 | 0 | 0 |
| bank select address 2 | 0 | 1 | 0 | 1 | 0 | 1 |

The circular buffer controller 300 generates pointers, each for selecting banks for writing and reading each frame of data (hereinafter, "write bank pointer" and "read write pointer"), and sets a distance between selected banks, each selected by the write bank pointer and the read bank pointer (hereinafter, "offset"). In detail, the circular buffer controller 300 selects the write bank pointer and the read bank pointer in response to a bank selection signal BS.

The RAM 180 may be realized by static random access memory (SRAM) or dynamic RAM (DRAM). In the SRAM and the DRAM, a plurality of banks are included and the reading/writing of data can be performed at a time. Preferably, the size of each bank is determined to be sufficient to store one frame of data. Further, a write address WR_ADD and a read address RD_ADD may be written to the RAM 180. In this case, an input pin and an output pin can be additionally included in the RAM 180 for the operation of reading or writing of data.

The length of the data, which is stored in the first through sixth banks 310 through 360 using a Galois field (GF) ($2^m$), is determined to be less than 256 bites. A signal output OUT from the bank block 301 of 8 bits, shown in FIG. 3, is input to the error corrector 190 of FIG. 1.

Figure 4:
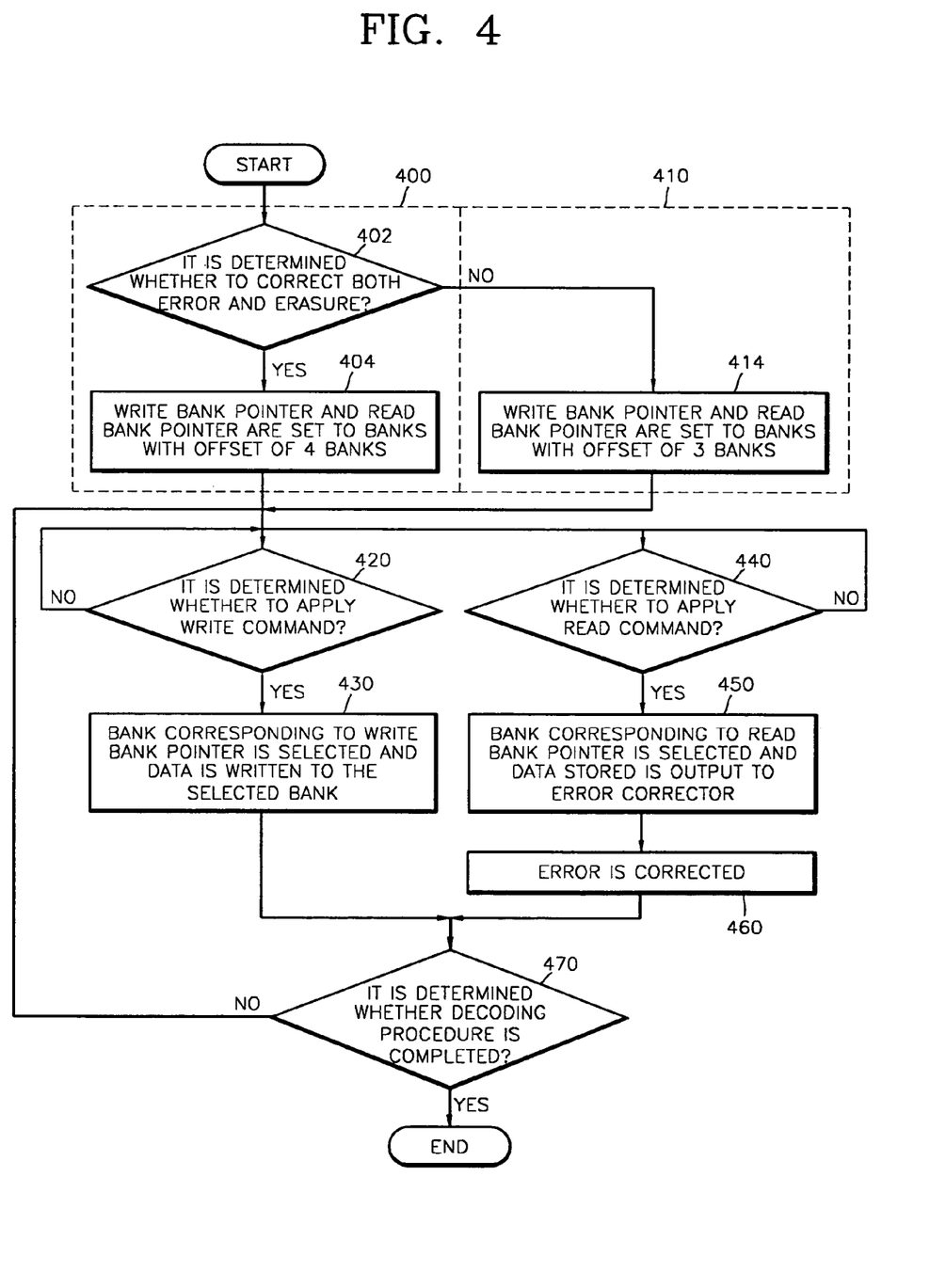
FIG. 4 is a flow chart illustrating a method of accessing a six-bank-1-RAM according to the present invention.

FIG. 4 is a flow chart illustrating a method of accessing a six-bank-1-RAM 180 according to the present invention. The operation of the RAM 180 and the method of accessing the RAM 180 will now be described in greater detail with reference to FIGS. 3, 4, 5 and 6.

Referring to FIG. 4, an offset between a write bank pointer and a read bank pointer is determined to be 4 banks for error and erasure corrections in step 400, and determined to be 3 banks for error correction only in step 410. In conclusion, the offset must be differently set in steps 400 and 410.

In step 402, whether correcting both error and erasure is completed is checked. In other words, whether to input an erasure flag ERA_FLAG in synchronization with an input data DIN is determined in step 402.

If it is determined that both error and erasure corrections are to be performed, a write bank pointer and a read bank pointer are set to banks with an offset of 4 banks, wherein the numbers of each of the write bank pointer and the read bank pointer are incremented for each frame of data in step 404. The reason why an offset of four banks is set for both error and erasure corrections is that the entire decoding procedure is carried out through the five stages. For example, if the read bank pointer is expressed as BANK#, a write bank pointer is expressed as BANK(#+4)MOD 6. The reason why a Modulus 6 (MOD 6) operation is performed, is that the number of the banks 310 through 360 totals six. Here, 4 denotes an offset between a write bank pointer and a read bank pointer.

Further, it is checked whether to apply a write command WR in step 420 and whether to apply a read command RD to each bank in step 440. The write command WR and the read command RD are output to the first through sixth banks 310 through 360 by the circular buffer controller 300 at the same time. That is, the writing/reading of data are performed at a time during the accessing of the RAM 180.

If it is determined in step 420 that the write command WR is to be applied, one of the banks 310 though 360 corresponding to a write bank pointer is selected and predetermined data DIN is written to the selected bank in step 430.

Figure 5:
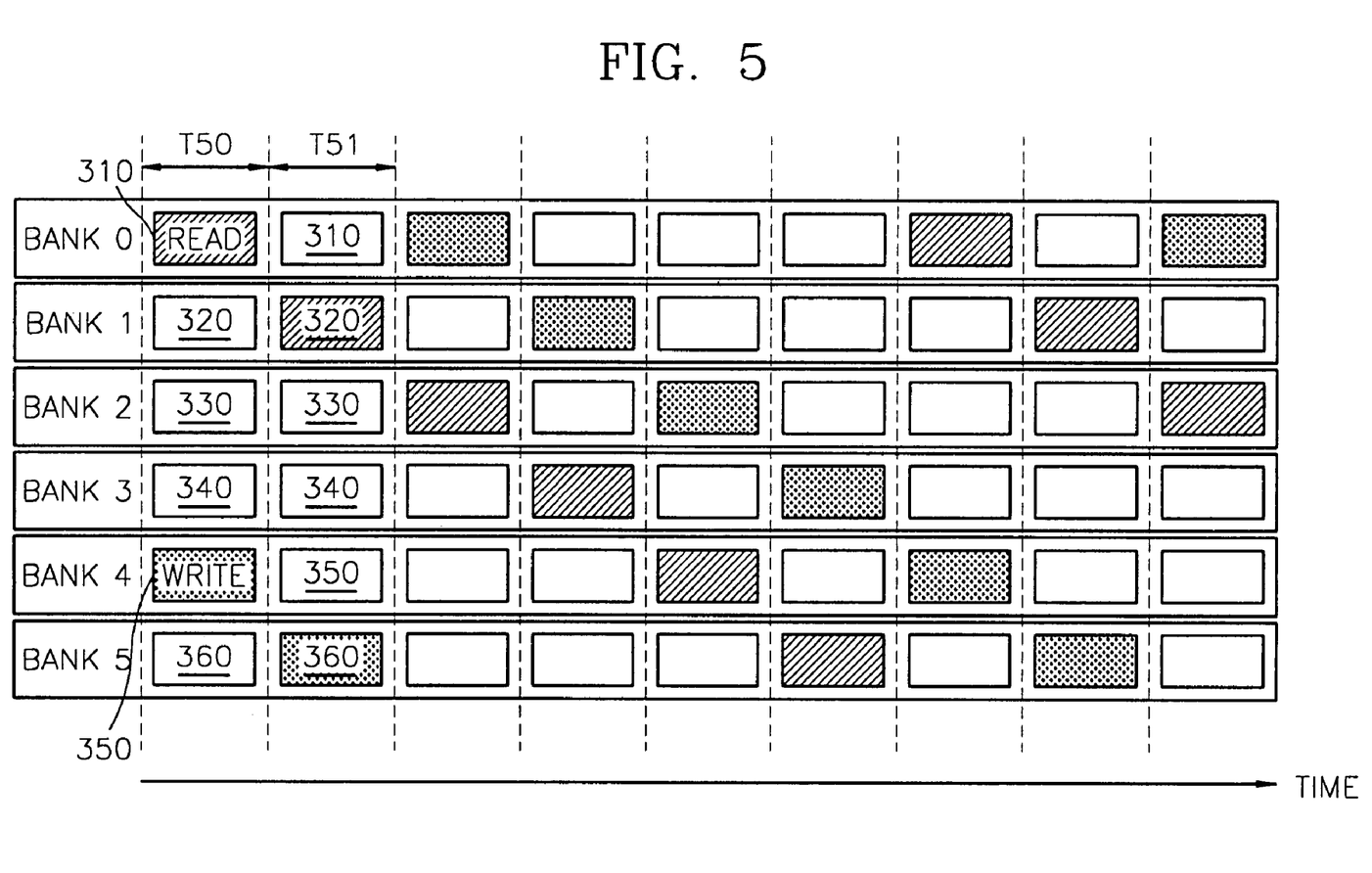
FIGS. 5 and 6 are views illustrating the selection of banks during writing/reading data in the six-bank-1-RAM of FIG. 3.

FIG. 5 illustrates the selection of banks for writing and reading each frame of data for error and erasure corrections in the six-bank-1-RAM of FIG. 3. Referring to FIG. 5, the number of a write bank pointer, which indicates a bank to which data is to be written, is incremented for each frame of data. For instance, as shown in FIG. 5, a fifth bank 350 corresponding to the write bank pointer is selected from a first frame T50 and then, predetermined data is written to the fifth bank 350.

Also, if it is determined in step 440 that the read command RD is to be applied, a first bank 310 corresponding to a read bank pointer is selected from the first frame T50, and then, the data stored in the first bank 310 is output to the error corrector 190 in step 450. As a result, an error is corrected in step 460.

As previously mentioned, the memory accessing procedure according to the write command WR and the read command RD, which is illustrated in FIG. 4, is repeated during the decoding process in the RS decoder. That is, whether the decoding procedure is completed or not is determined in step 470. If it is determined that the decoding is completed, the decoding procedure ends. In contrast, if it is determined that the decoding of the RS decoder is not completed, the process goes back to-steps 420 and 440 for continuing memory accessing.

As shown in FIG. 5, the data stored in the first bank 310, which is selected by the read bank pointer, can be output to the error corrector 190 of FIG. 1 concurrently with writing data to the fifth bank 350 selected by the write bank pointer in the first frame T50. Similarly, the data stored in the second bank 320, which is selected by the read bank pointer, can be output to the error corrector 190 of FIG. 1 concurrently with writing data to the sixth bank 360 selected by the write bank pointer in a second frame T51.

Accordingly, the write bank pointer and the read bank pointer can be set to banks with an offset of four banks, and thus, the same bank cannot be accessed for writing and reading at once, thereby preventing data collision which possibly occurs when accessing the same RAM. For this reason, the memory accessing is carried out in response to the system clock, thus quickly achieving the decoding of the RS decoder without time loss.

On the other hand, if it is determined in step 400 that both error and erasure corrections are not to be performed, i.e., only error correction is to be performed, no erasure flags ERA_FLAG are input, or the number of flags counted is beyond the allowed correction range.

Figure 6:
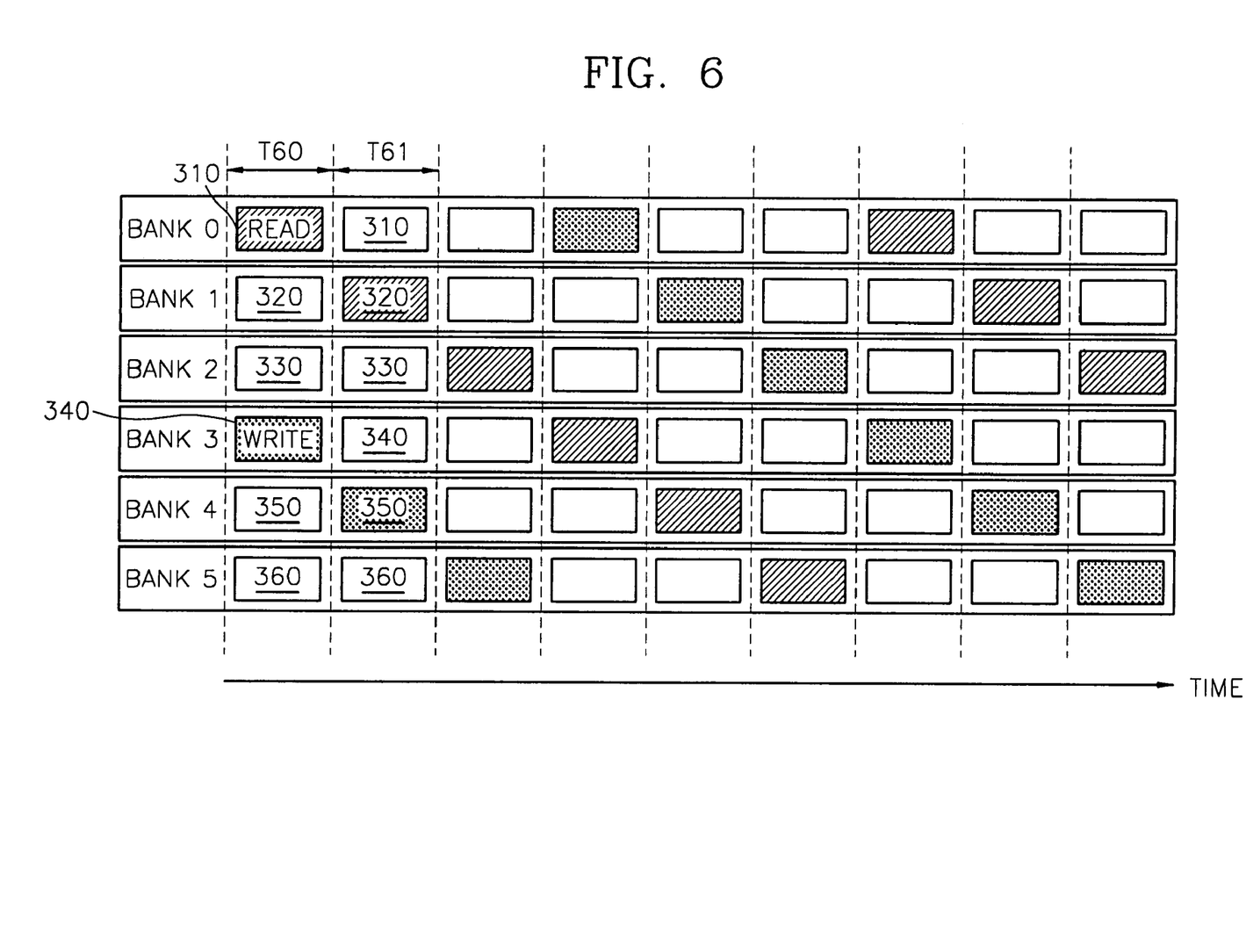

FIG. 6 illustrates the selection of banks for the writing and reading of each frame of data in the six-bank-1-RAM 180 shown in FIG. 3, which corrects only errors, not erasures.

In the case where the RS decoder of FIG. 1 corrects only errors, an offset between the write bank pointer and the read bank pointer is set to be three banks in step 414. This is because the entire decoding procedure is completed through four stages. For example, if the read bank pointer is expressed as BANK#, then the write bank pointer is expressed as BANK (#3)MOD 6. Here, '#3' denotes an offset between the read bank pointer and the write bank pointer.

Referring to FIG. 6, in the first frame T60, it is possible to write data to a fourth bank 340 selected by the write bank pointer and output the data stored in the first bank 310, which is selected by the read bank pointer, to the error corrector 190 of FIG. 1. In the second frame T61, it is also possible to write data to the fifth bank 350 selected by the write bank pointer and output the data stored in the second bank 320, which is selected by the read bank pointer, to the error corrector 190 of FIG. 1.

Therefore, the write bank pointer and the read bank pointer can be set to banks with an offset of three banks per frame, and thus, the same bank cannot be accessed for writing and reading at the same time, thereby preventing data collision which possibly occurs when accessing the same RAM.

Figure 7:
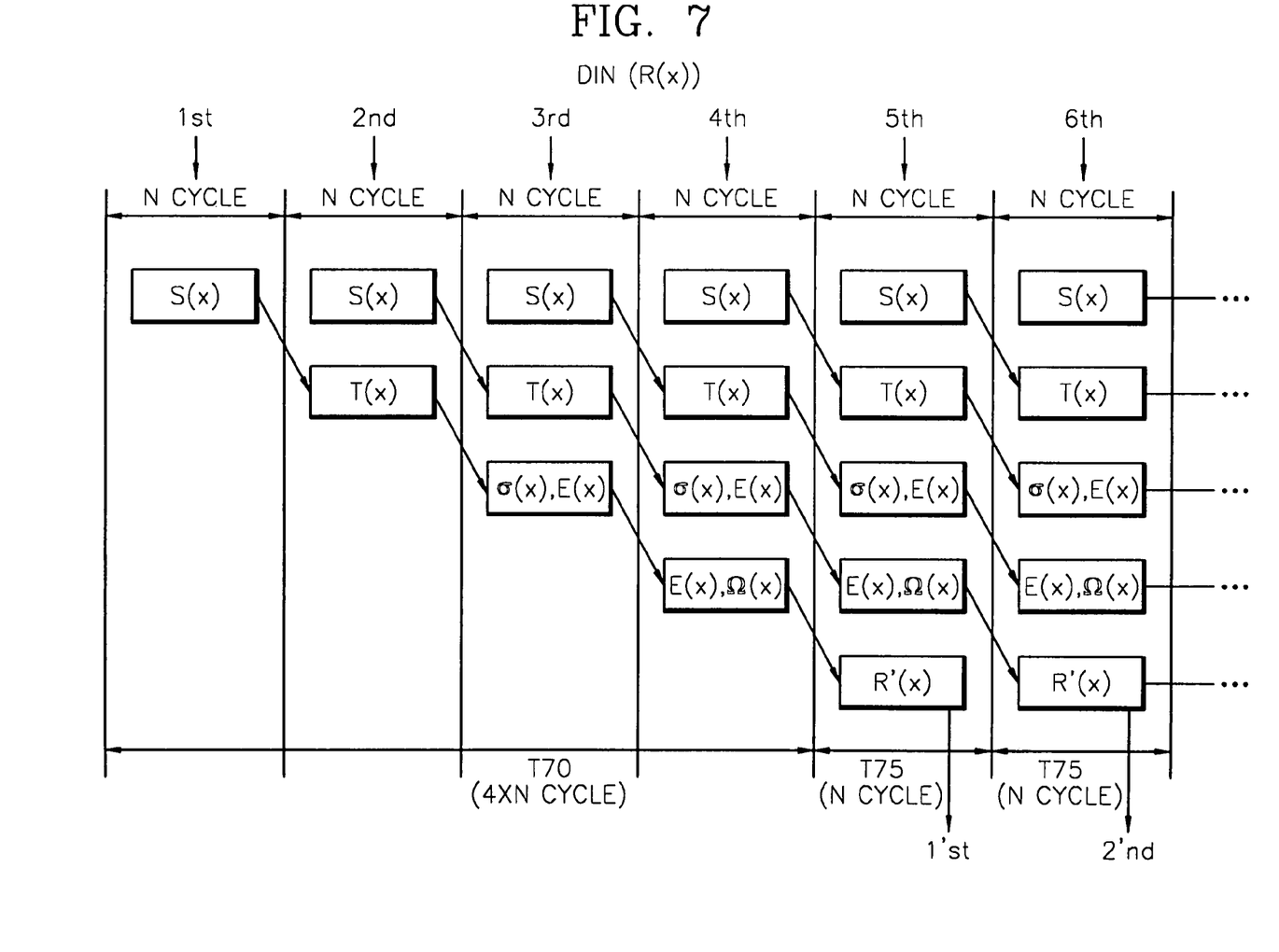
FIG. 7 is a timing diagram of the process of the RS decoder of FIG. 1.

FIG. 7 is a timing diagram of a decoding procedure of a block pipelined RS decoder according to the present invention. Referring to FIG. 7, the operation in each stage is completed within n cycles owing to no data collision in accessing the memory. Also, input data DIN is continuously applied every cycle of the decoding procedure to generate a syndrome S(x). The result of each stage is transferred to the subordinate processing stage every n cycles. In particular, a syndrome S(x) and a modified syndrome T(x) are generated in a second n cycle, and coefficients of an error locator polynomial σ(x) and an error value polynomial E(x) are generated in a third n cycle. In the fourth and fifth cycles, the same performance is carried out as in the first and second cycles.

Further, as shown in FIG. 7, the entire latency delay T70 is 4×n cycles, and error corrected data DOUT, i.e., R'(x), is output every n cycles after 4 n cycles. In FIG. 7, an interval T75 denotes a throughput delay in an actual processing procedure, rather than a latency delay.

As described above, a six-bank-1-RAM and a RS decoder adopting the six-bank-1-RAM, according to the present invention, have wide applications including, for example, optical disc systems such as high-definition digital versatile discs (HD-DVD), HD-TV, satellite communications, wireless communications equipment such as IMT-2000, network systems such as giga Ethernet, and ultrahigh speed systems which require a RS decoder.

As previously described, according to the present invention, the data input clock for accessing memory can be used as the system clock, so that the manufacture of the semiconductor device is simplified, power consumption decreases and the operation speed of a RS decoder increases. Manufacturing costs can also be reduced due to a simple manufacturing process because a RS decoder according to the present invention uses a 1-RAM including a plurality of banks. Further, it is possible to maximize the performance of a RS decoder if the RS decoder is designed and manufactured as a system-on-chip.

In addition, time loss caused by accessing memory can be minimized, and the system clock rate is less affected by the memory access time, thereby virtually increasing the degree of freedom in timing margin between blocks in designing systems. Furthermore, the inventive 6-bank-1-RAM enables high-speed transmissions, so that it is suitable for a high-speed pipelined RS decoder and ultrahigh speed systems adopting the RS decoder.

In the drawings and specifications, typical preferred embodiments of the invention are disclosed, and although specific terms are employed, they are used in a generic and descriptive sense only and not for purposes of limitation. It will be understood by those skilled in the art that various changes in form and details may be made to the described embodiments without departing from the spirit and scope of the invention as defined by the appended claims.

What is claimed is:

1. A random access memory (RAM) which data is written to and read from at the same time during decoding of one frame of data, the RAM comprising a plurality of banks, wherein:
   when a first bank is selected from the plurality of banks in response to a first control signal, predetermined data is written to the first bank;
   when a second bank is selected from the plurality of banks in response to a second control signal, the data stored in the second bank is output;
   the first and second banks are selected with a predetermined offset per frame of data;
   the plurality of banks is configured to store data correlated to the operation of a pipelined in processor having a plurality stages; and
   the predetermined offset corresponds to a number of banks configured between the first bank and the second bank, and a value of the predetermined offset is based on the number of pipeline stages.

2. The RAM of claim 1, wherein the RAM is SDRAM or DRAM.

3. The RAM of claim 1, wherein the size of each bank is determined to be sufficient to store one frame of data.

4. The RAM of claim 1, wherein the writing of data is performed via an input pin and the reading of data is performed via an output pin.

5. The RAM of claim 1, wherein the first control signal comprises a first bank selection signal for selecting the first bank and a write command signal for commanding writing of the predetermined data to the first bank, and
   the second control signal comprises a second bank selection signal for selecting the second bank and a read command signal for commanding reading of data from the second bank.

6. The RAM of claim 1, wherein the value of the predetermined offset is one less than the number of pipeline stages.

* * * * *